United States Patent [19]

Mayeda et al.

[11] Patent Number: 5,635,244
[45] Date of Patent: Jun. 3, 1997

[54] METHOD OF FORMING A LAYER OF MATERIAL ON A WAFER

[75] Inventors: Mark I. Mayeda, Las Vegas, Nev.; Wilbur G. Catabay, Santa Clara; Joe W. Zhao, San Jose, both of Calif.

[73] Assignee: LSI Logic Corporation, Milpitas, Calif.

[21] Appl. No.: 520,058

[22] Filed: Aug. 28, 1995

[51] Int. Cl.$^6$ .................................................. C23C 16/06
[52] U.S. Cl. .......................................... 427/248.1; 118/715
[58] Field of Search .............................. 118/715, 719, 118/724, 225; 427/248.1, 255

[56] References Cited

U.S. PATENT DOCUMENTS

| | | | |
|---|---|---|---|
| 5,094,885 | 3/1992 | Selbrede | 427/248.1 |
| 5,180,432 | 1/1993 | Hansen | 118/697 |
| 5,356,476 | 10/1994 | Foster et al. | 118/725 |

Primary Examiner—Felisa C. Garrett
Attorney, Agent, or Firm—Hickman Beyer & Weaver

[57] ABSTRACT

Disclosed is a wafer clamp which holds a wafer in place during chemical vapor deposition processes. The wafer clamp includes (1) a clamp body having an inner facing portion and an outer facing portion; and (2) an overhang member attached to and extending inwardly from the inner facing portion of the clamp body. The clamp is designed such that when it holds the wafer, the overhang member extends over the wafer's peripheral region and is separated from that peripheral region by at least a predefined distance. The peripheral region is a region on the wafer's upper face that resides near the perimeter of the upper face. The predefined distance is chosen such that during deposition, a layer of material does not contact both the wafer face and the overhang member. The predefined distance is at least about 100 times the thickness of the layer of material. When the disclosed wafer clamp is used to hold a wafer for reaction in a chemical vapor deposition reactor, a deposition layer is formed that contacts only the wafer and not the clamp as well.

11 Claims, 3 Drawing Sheets

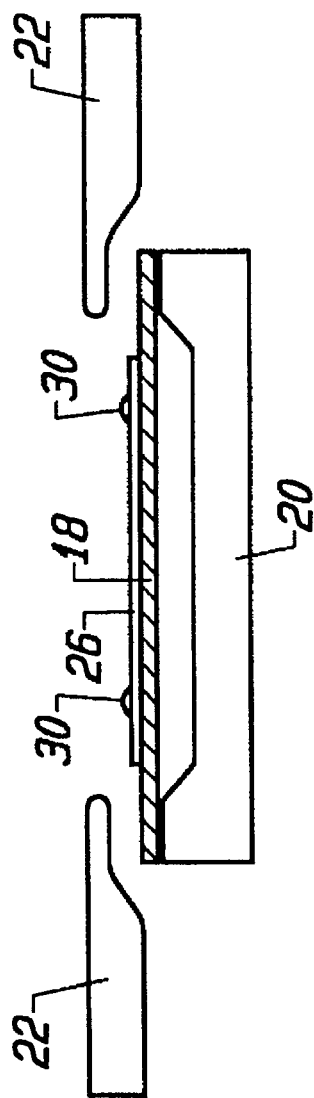
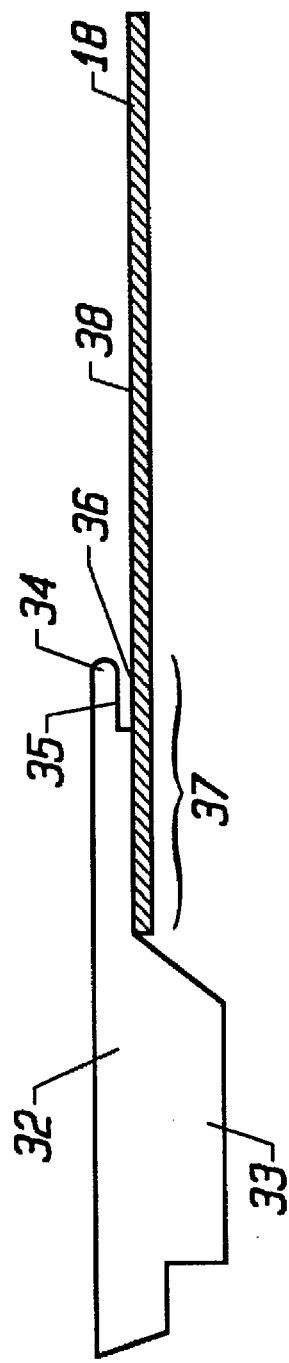

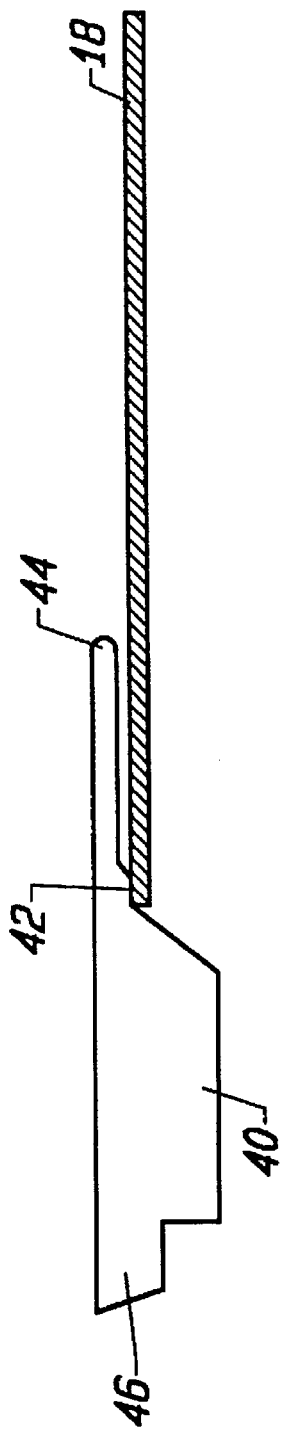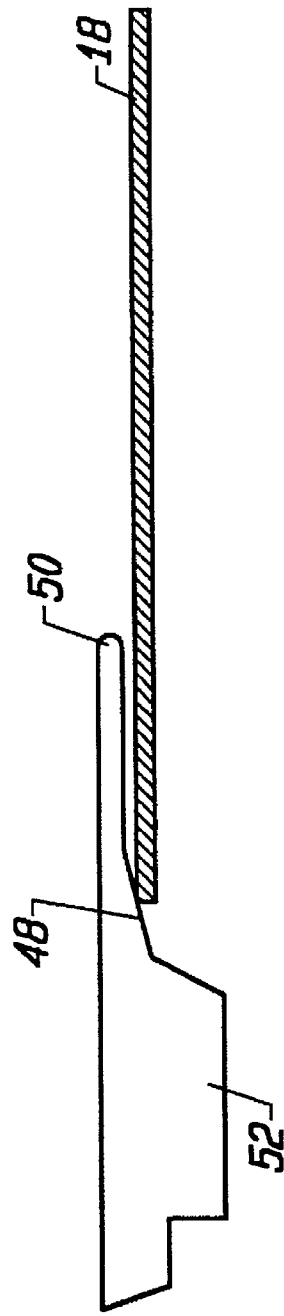

METHOD OF FORMING A LAYER OF MATERIAL ON A WAFER

BACKGROUND OF THE INVENTION

This invention relates generally to clamps for holding wafers during processing in deposition chambers. In particular, the invention relates to clamps that prevent bridges of deposition materials from forming between the wafer and the wafer clamp.

During fabrication of integrated circuits, chemical vapor deposition (CVD) is employed to deposit layers of certain materials such as polysilicon, tungsten, and silicon nitride on a semiconductor wafer substrate. In the CVD process, gaseous reactants chemically react to deposit individual atoms of a particular element or elements on the wafer surface. FIG. 1 illustrates a conventional CVD processing chamber generally referred to by the reference numeral 10. A hermetically sealed chamber 12 provides a contaminant-free environment for the deposition reaction. A gas box 14, located outside of chamber 12, supplies the gaseous chemical reactants at predefined flow rates and pressures to a shower head 16 located inside chamber 12. The shower head 16 serves to disperse the gaseous reactants evenly throughout the top of chamber 12. Once inside the chamber 12, the reactants are converted to a plasma in order to increase their reactivity. The active reactants then flow or diffuse throughout the reactor interior and ultimately react on the surface of wafer 18 to deposit a layer. During the CVD reaction, the wafer 18 is supported by a susceptor 20 (or other support) and secured to the susceptor by a wafer clamp 22.

Recently, it has been observed that in certain CVD reactors, such as the P-5000 available from Applied Materials, Inc. of Santa Clara, Calif., the deposition process sometimes produces a deposition layer that contacts and adheres to the wafer clamp 22 as well as the wafer 18. When this happens, part of the layer breaks off of the wafer when the wafer is unclamped. IC yield is thereby decreased in at least two ways. First, any ICs on the periphery of the wafer which have their associated deposition layer partially removed will be unusable. Second, particles of deposition material generated when the wafer is unclamped may settle on the wafer surface where they can destroy other ICs. These problems are illustrated in FIGS. 2a and 2b.

Referring first to FIG. 2a, a prior clamp-wafer-susceptor assembly 24 is shown with a deposited layer 26. Clamp 22 of assembly 24 is of circumferential configuration and applies a downward force normal to a top surface of wafer 18 so as to secure wafer 18 against the susceptor 20. Clamp 22 includes an overhang member 23 which has a rounded edge and overlies a peripheral region of the semiconductor wafer—i.e., approximately the outer 5 mm of the wafer top surface. While the goal of CVD is to form a layer on an active area of wafer 18 (i.e., the area where the ICs are formed), the gaseous reactants diffuse throughout reactor chamber and deposit material on other surfaces as well. Further, some reactant molecules/radicals move in horizontal as well as vertical directions, thereby finding their way into crevices or cavities where they react and deposit solid material. For example, the layer 26 on wafer 18 can extend slightly under the rounded edges of overhang members 23 to form a buildup or bridge of deposited material 28 between clamp 22 and the wafer 18. As noted, when the clamp is lifted up to release the wafer 18, some of layer 26 will break away and form flakes which may land on the wafer surface. Further, the layer 26 may break away at some peripheral ICs, thereby destroying them. Specifically, in the case of tungsten deposition to fill vias, when the overlying tungsten layer is partially broken off by unclamping, the tungsten in the underlying vias is exposed and etched away during a subsequent etch back step. Thus, the amount of tungsten in the via will be inadequate to provide electrical contact between vertically separated layers.

FIG. 2b illustrates the problem of the flakes settling on the wafer surface. After tungsten (or other material) deposition is complete, the wafer 18 is unclamped from clamp 22 for further processing. As shown, small tungsten flakes 30 may break off from the bridges 28 (shown in FIG. 2a) during unclamping and then fall onto the newly deposited layer 26. These flakes can destroy ICs in various ways. For example, they may block complete etch back of tungsten layer 26 in subsequent steps, thereby providing an unintended conductive path or short between metallization lines. This is because the etch back process removes the same amount of tungsten regardless of variations in tungsten layer thickness (caused by the flakes for example). Thus, the etch does not planarize the wafer surface, and flakes 30 constitute, in effect, micromasks which produce metal images of themselves on the underlying wafer surface following etch back. Such residual metal images may contact a subsequent deposited metal layer thereby shorting it to the metal layer below.

It should be noted that the problem of bridging can occur with many different depostion materials. However, it very frequently occurs when depositing tungsten because tungsten formed from $WF_6$ and $SiH_4$ tends to deposit in small crevices or cavities. While this property makes tungsten a good choice for filling vias to make contacts, it unfortunately also promotes buildups such as bridge 28.

In view of the above, what is needed is a clamp design that reduces the likelihood of bridging material forming between the clamp and wafer during deposition.

SUMMARY OF THE INVENTION

To achieve the foregoing, the present invention provides wafer clamps (and methods of using such wafer clamps) which hold a wafer in place during deposition processes but resist formation of the above-described bridges. Specifically, the clamp is designed such that it has an overhang member that is spaced above and apart from the wafer surface. That is, the bottom surface of the overhang member does not contact the wafer surface. Rather, it is separated from the wafer surface by a sufficient distance that layers of material deposited on the wafer do not contact the wafer clamp. Thus, a processed wafer can be safely unclamped—using a clamp of this invention—without fracturing the deposited layer in the peripheral regions of the wafer. Using a wafer clamp of this invention, the deposited layer will extend under an inner edge of the overhang member for some short distance, but it will not be thick enough to contact the overhang member or any other part of the wafer clamp.

In one aspect, the present invention provides a wafer clamp that can be characterized as including the following elements: (1) a clamp body having an inner facing portion and an outer facing portion; and (2) an overhang member attached to and extending inwardly from the inner facing portion of the clamp body. The clamp is designed such that when it holds the wafer, the overhang member extends over the wafer's peripheral region and is separated from that peripheral region by at least a predefined distance. The peripheral region is a region on the wafer's upper face that resides near the perimeter of the upper face. Further, the predefined distance is chosen such that during deposition, a layer of material does not contact both the wafer face and the overhang member. Preferably, the predefined distance is at least about 50 times the thickness of the layer of material, and more preferably, at least about 100 times the thickness of the layer. In a currently conventional tungsten depostion reactor, for example, the predefined distance is preferably at least about 1 mm.

In order to prevent the deposited layer from extending all the way to the edge of the wafer where it could contact the clamp body, the predefined distance should not be arbitrarily large. Thus, in preferred embodiments, the clamp is designed so that when it holds the wafer, the ratio of (a) the predefined distance separating the overhang member from the wafer's peripheral region to (b) the distance that the overhang member extends over the wafer's peripheral region is no more than about 1:5. More preferably, this ratio is between about 1:1.5 and 1:5. A clamp designed within this range of aspect ratios will generally prevent the deposited material from finding its way to the outer edge of the wafer where it might contact and adhere to the clamp body.

Another aspect of the invention includes a method of forming a layer of material on a wafer in a deposition reactor. The method may be characterized as including the following steps: (1) positioning the wafer within the deposition reactor; (2) engaging the wafer with a clamp to hold the wafer at a defined location within the deposition reactor; and (3) depositing the layer of material on the wafer in the deposition reactor such that the layer of material does not contact both the wafer face and the clamp. In practicing this method, the clamp should have a structure including a clamp body and an overhang member as described above. Thus, the clamp used in the method should be designed such that the overhand member is separated from the wafer face by at least about 50 times the thickness of the layer. In preferred embodiments, the clamp will engage the wafer along the wafer's edge without substantially contacting the face of the wafer. Typically, after the layer of material is deposited, the wafer is further processed to form one or more integrated circuits.

These and other features and advantages of the present invention will become apparent upon reading the following detailed description in conjunction with the associated figures.

BRIEF DESCRIPTION OF THE DRAWINGS

FIG. 2b is a cross sectional view illustration of the clamp assembly of FIG. 2a showing the generation of a flake when the wafer is unclamped.

FIG. 3a is a cross sectional view illustration of a first embodiment of a clamp in accordance with the present invention.

FIG. 3b is a cross sectional view illustration of a second embodiment of a clamp in accordance with the present invention.

FIG. 3c is a cross sectional view illustration of a third embodiment of a clamp in accordance with the present invention.

DETAILED DESCRIPTION OF THE PREFERRED EMBODIMENTS

Figure 1:
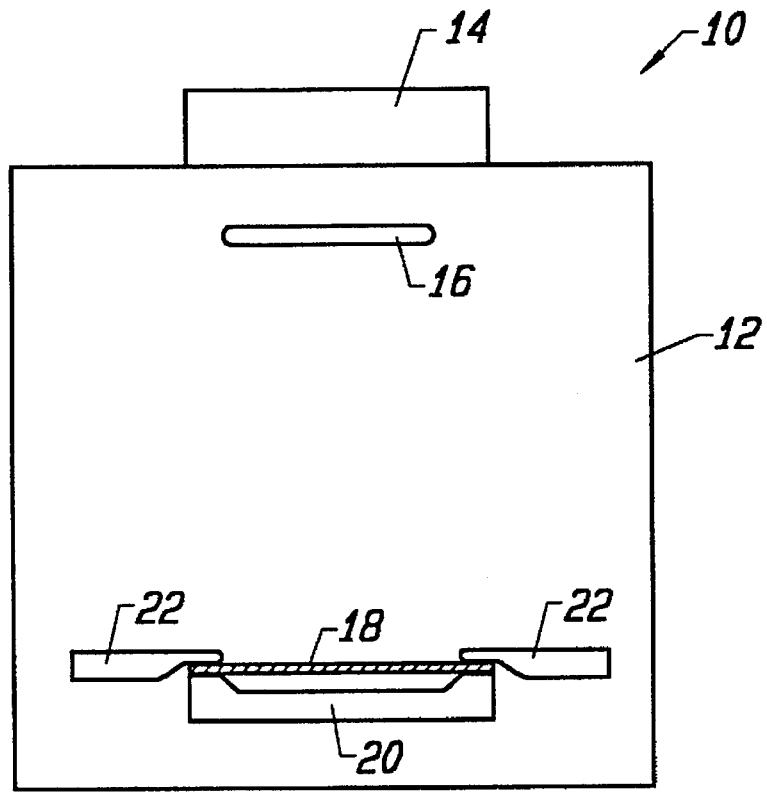
FIG. 1 is a side view illustration of a CVD chamber including a clamp assembly of the prior art.
Figure 2A:
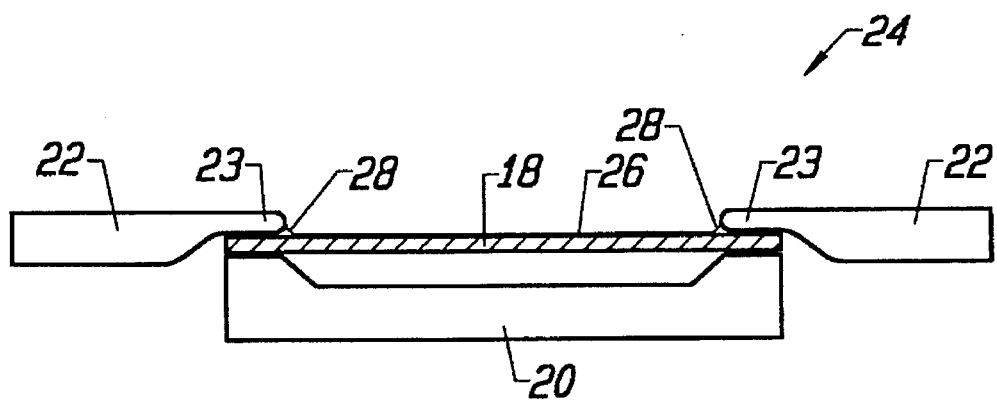
FIG. 2a is a cross sectional view illustration of the clamp assembly of FIG. 1 showing the problem associated with prior art designs in which a deposition layer forms a buildup bridge between a wafer clamp and a wafer.

A discussion of FIGS. 1, 2a, and 2b which show prior clamps was provided above. Wafer clamps in accordance with the present invention for holding a wafer or other substrate during deposition in a CVD reactor are described hereinafter.

Referring first to FIG. 3a, a clamp for securing a wafer in a CVD chamber in accordance with a first embodiment of the present invention is shown and described. For simplicity, the susceptor and right side of the clamp/wafer are not shown. A circumferential clamp 32 of the present invention includes two components of primary interest: a body portion 33 and an overhang member 34. The body portion 33 will usually be the more massive of the two components and will be designed to encircle a wafer 18 in a manner such that most mass of the body lies outside of an outer edge or perimeter of the wafer. An inner facing portion of the clamp body 33, which is coupled to the overhang member 34, engages the wafer 18 (e.g., a silicon or gallium arsenide substrate) and exerts a downward force normal to a wafer top surface 38 as described above. Thus, the wafer is held in a fixed location against a susceptor or other support (not shown) during deposition in the CVD chamber. In this embodiment, the inner portion of the clamp body 33 that contacts the wafer 18 represents at least about 6 mm edge exclusion of the wafer's radius. This large contact area ensures secure clamping. The overhang member 34 is also circular or circumferential in shape and in most embodiments lies entirely over the wafer's top surface.

The wafer includes a peripheral region 37 which underlies a portion of the clamp 32 including the clamp's overhang member 34. In contrast to the prior wafer clamps shown in FIGS. 1 and 2, clamp 32 is designed so that a bottom surface 35 of the overhang member is separated from the wafer top surface 38 by a predefined distance. That is, the overhang member 34 is suspended above or "shadows" the wafer surface 38. Thus, a gap 36 exists between overhang member 34 and wafer 18. Because some reactant molecules/radicals move horizontally, a deposited layer will typically extend partially into gap 36. However, the overhang member 34 blocks most of the molecules/radicals from the wafer peripheral region 37, thus limiting the extent that the layer grows into gap 36. So long as the predefined distance is chosen to be sufficiently great, the part of the layer which does extend into the gap 36 will not contact overhang member 34 or any other portion of wafer clamp 32. Thus, the problems associated with bridging between the wafer and wafer clamp are avoided with the present invention.

The exact magnitude of the predefined distance between the wafer and the overhang member will vary depending upon various factors including the chemical nature of the reactants, the mean free path of the reactant species in the chamber, and the nature of the layer that they form. For tungsten layers formed by reaction of $WF_6$ and $SiH_4$, the predefined distance preferably should be at least 50 times the ultimate thickness of the deposited layer, and more preferably at least 100 times that thickness. Thus, for a typical tungsten layer formed with current technology, the predefined distance should be at least about 1 mm. As most deposited layers are no more likely than tungsten to form bridges, the above values should be generally adequate regardless of a layer's chemical composition. However, if a minimal value of the predefined distance is desired, it can be obtained by simply conducting a series of experiments with the chemical system of interest and varying the spacing between the overhang member and the underlying substrate. The minimal spacing required to avoid bridging represents the predefined distance.

It should be noted that the spacing between the overhang member and the wafer should not be made arbitrarily large.

When the spacing becomes too great, the designer risks having the deposition layer extend to the edge of the wafer top surface where it may contact the clamp. In effect, the overhang member fails to provide a blocking function, and allows the reactant species to migrate relatively far toward the wafer edge. This problem becomes more pronounced as the predefined distance approaches the value of the mean free path of the reactant species. To mitigate this problem, wafer clamps of this invention should be designed such that the gap formed under the overhang member has at most a specified aspect ratio. Such ratio is given by the ratio of (a) the predefined distance separating the overhang member from the wafer's peripheral region to (b) the distance that the overhang member extends over the wafer's peripheral region. Preferably this ratio is no more than about 1:5, and more preferably the ratio is between about 1:1.5 and 1:5. In most systems, this will require that the overhang member extends over the wafer's peripheral region by a distance of between about 1 and 10 mm, and more preferably by a distance of between about 3 and 5 mm.

Referring now to FIG. 3b, a wafer clamp 46 for securing a wafer in a CVD chamber in accordance with a second embodiment of the present invention is shown. The body portion 40 is similar to the body portion of FIG. 3a. However, an inner facing portion 42 of body 40 in contact with the top surface of wafer 18 is significantly reduced and in the range of about 0.5 to 1.5 mm of the wafer's radius, enough to securely hold the wafer, yet significantly increasing the aspect ratio of the gap under overhang member 44. Thus, overhang member 44 extends significantly over the peripheral region of wafer 18. In this embodiment, the end of the overhang member 42 preferably extends about 3 to 5 mm from the edge of the wafer.

Referring now to FIG. 3c, a clamp for securing a wafer in a CVD chamber in accordance with a third embodiment of the present invention is shown. In this embodiment, inner facing protion 48 of clamp body 52 is angled such that it engages only the edge of wafer 18 to hold it into place. Overhang member 50 extends substantially over all of the wafer surface's peripheral region. This embodiment minimizes the aspect ratio of the gap under the overhang member. In each of the embodiments shown in FIGS. 3a through 3c, the edge of the wafer's top surface is contacted by the wafer clamp. However, the amount of additional wafer surface area contacted by the clamp varies with the embodiments. The embodiments of FIGS. 3b and 3c can be employed to reduce the amount of wafer area required for clamping and thereby increase the amount of wafer area available for fabricating ICs. Currently, clamps occupy about the outer 5 cm of the wafer and ICs are formed on all but about the outer 6 cm of the wafer. By reducing the length of the overhang member in the embodiments of FIGS. 3b and 3c, while preserving the aspect ratio required to prevent bridging, more of the wafer may be used for fabricating ICs. In a preferred embodiment, the clamp including the overhang member and the inner facing portion of the clamp body occupies no more than about the outer 3 cm of the wafer surface, and more preferably no more than the outer 1 cm of the wafer surface.

Preferably, the wafer clamps of this invention are used as follows. Initially, one or more wafers is introduced into a deposition reactor such as a tungsten deposition reactor. The wafers may have been previously aligned in an alignment chamber near the deposition reactor. Once in the deposition chamber interior, each wafer is positioned at a defined location such as on a susceptor or other support. Next, the positioned wafer is engaged by a clamp of this invention to hold the wafer at the defined location within the deposition reactor. This forms a slot underneath the overhang member of the clamp as explained above. If a clamp of the type illustrated FIG. 3c is employed, the clamp will contact the wafer along the edge of its face without substantially contacting the face of the wafer. As noted, the clamp holds the wafer in position by compressing the wafer against its underlying support. If this support is a susceptor, it will be used to heat the wafer during the deposition process.

After the wafer is clamped in position within the reactor chamber, the reactant species are introduced into the reaction chamber where they may be converted to a plasma before reacting to deposit a layer on the wafer—such that the layer does not contact both the wafer face and the clamp. It should be noted that the reactant species may be introduced into the reaction chamber by a variety of means, but preferably they enter through a gas panel which controls their flow characteristics. Further the particular species introduced into the chamber may or may not converted to a plasma before reacting with the wafer. After the deposition reaction is complete, the wafer is deengaged from the clamp without generating any flakes of the deposited material.

After the deposition reaction is complete and the wafer is unclamped, it will be moved to other processing regions such as an etch back chamber to remove a defined thickness of deposited material. Other steps such as forming and patterning metallization layers, depositing dielectric layers, etching the dielectric layers, forming interconnects, etc. may be employed on route to forming completed IC chips on the wafer.

While this invention has been described in terms of several preferred embodiments, there are alterations, permutations, and equivalents which fall within the scope of this invention. It should also be noted that there are many alternative ways of implementing both the process and apparatus of the present invention. For example, while the invention has been described primarily in terms of tungsten depostion in a CVD reactor, there is in principle no reason why the clamps of this invention can not be used in other deposition reactors such as oxide or nitride CVD reactors or in sputtering or other physical deposition reactors. Further, the substrates on which the deposited layer is being formed need not be a semiconductor wafers, but could be for example polyimide substrates used in small multilayer printed circuit boards, etc. It is therefore intended that the following appended claims be interpreted as including all such alterations, permutations, and equivalents as fall within the true spirit and scope of the present invention.

What is claimed is:

1. A method of forming a layer of material on a wafer in a deposition reactor, the wafer having a face and a peripheral region at an edge of said face, the method comprising the following steps:

positioning the wafer within said deposition reactor;

engaging the wafer with a clamp to hold said wafer at a defined location within the deposition reactor; and depositing said layer of material on the wafer in the deposition reactor, wherein the clamp includes (a) a clamp body having an inner facing portion and an outer facing portion, and (b) an overhang member attached to and extending inwardly from the inner facing portion of the clamp body such that when the clamp holds said wafer, the overhang member extends over said wafer's peripheral region and is separated from said peripheral region by at least a separation distance, wherein said separation distance being chosen to ensure that the layer of material deposited does not contact both the wafer face and the clamp.

2. The method of claim 1 further comprising a step of deengaging the wafer after said step of depositing, said step of deengaging producing no flakes of the deposited material.

3. The method of claim 2 further comprising one or more of the following steps for converting the wafer to one or more integrated circuits:

forming a metallization layer;

patterning the metallization layer;

depositing dielectric layer;

etching said dielectric layer;

forming an interconnect.

4. The method of claim 1 wherein the step of engaging provides a force to the face of the wafer such that the wafer is held in compression against a susceptor.

5. The method of claim 1 wherein the step of depositing said layer deposits tungsten on said wafer.

6. The method of claim 1 wherein in the step of engaging the wafer, the clamp contacts the wafer along the edge of its face.

7. The method of claim 1 wherein while said clamp engages the wafer, the overhang member is separated from said peripheral region by at least about 50 times the layer of material's thickness.

8. The method of claim 7 wherein said overhang member is separated from said peripheral region by at least about 1 mm.

9. The method of claim 1 wherein while said clamp engages the wafer, the overhang member extends over the wafer's peripheral region by a distance of between about 1 and 10 mm.

10. The method of claim 9 wherein the overhang member extends over the wafer's peripheral region by a distance of between about 3 and 5 mm.

11. The method of claim 9 wherein, while said clamp engages the wafer, the ratio of (a) the separation distance separating the overhang member from the wafer's peripheral region to (b) the distance that the overhang member extends over the wafer's peripheral region is no more than 1:5.

* * * * *